US009865430B2

(12) United States Patent
Koo et al.

(10) Patent No.: US 9,865,430 B2
(45) Date of Patent: Jan. 9, 2018

(54) BORON IMPLANTING USING A CO-GAS

(71) Applicant: Varian Semiconductor Equipment Associates, Inc., Gloucester, MA (US)

(72) Inventors: Bon-Woong Koo, Andover, MA (US); Vikram M. Bhosle, North Reading, MA (US); John A. Frontiero, Rockport, MA (US); Nicholas P.T. Bateman, Reading, MA (US); Timothy J. Miller, Ipswich, MA (US); Svetlana B. Radovanov, Brookline, MA (US); Min-Sung Jeon, Jeoniu (KR); Peter F. Kurunczi, Cambridge, MA (US); Christopher J. Leavitt, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/949,421

(22) Filed: Nov. 23, 2015

(65) Prior Publication Data

US 2016/0163510 A1 Jun. 9, 2016

Related U.S. Application Data

(60) Provisional application No. 62/087,071, filed on Dec. 3, 2014.

(51) Int. Cl.
   *B05D 5/00* (2006.01)
   *C09D 11/10* (2014.01)
   (Continued)

(52) U.S. Cl.
   CPC .......... *H01J 37/3171* (2013.01); *H01J 37/08* (2013.01); *H01J 2237/006* (2013.01); *H01J 2237/0822* (2013.01)

(58) Field of Classification Search
   CPC .. C23C 14/00; H01J 37/3171; H01J 2237/006
   See application file for complete search history.

(56) References Cited

U.S. PATENT DOCUMENTS

| 5,977,552 A | * | 11/1999 | Foad | ........................ | H01J 27/04 |
| | | | | | 250/423 R |
| 6,221,169 B1 | * | 4/2001 | Bernstein | .............. | H01J 37/317 |
| | | | | | 134/1 |

(Continued)

FOREIGN PATENT DOCUMENTS

WO    2012/037007 A2    3/2012

OTHER PUBLICATIONS

Office action dated Jul. 13, 2016 in co-pending U.S. Appl. No. 14/692,159.

(Continued)

*Primary Examiner* — Dah-Wei D Yuan
*Assistant Examiner* — Kristen A Dagenais
(74) *Attorney, Agent, or Firm* — Nields, Lemack & Frame, LLC

(57) ABSTRACT

An apparatus and methods of improving the ion beam quality of a halogen-based source gas are disclosed. Unexpectedly, the introduction of a noble gas, such as argon, to an ion source chamber may increase the percentage of desirable ion species, while decreasing the amount of contaminants and halogen-containing ions. This is especially beneficial in non-mass analyzed implanters, where all ions are implanted into the workpiece. In one embodiment, a first source gas, comprising a dopant and a halogen is introduced into an ion source chamber, a second source gas comprising a hydride, and a third source gas comprising a noble gas are also introduced. The combination of these three source gases (Continued)

produces an ion beam having a higher percentage of pure dopant ions than would occur if the third source gas were not used.

12 Claims, 5 Drawing Sheets

(51) Int. Cl.
*C23C 14/22* (2006.01)
*H01J 37/317* (2006.01)
*H01J 37/08* (2006.01)

(56) References Cited

U.S. PATENT DOCUMENTS

| | | | |
|---|---|---|---|
| 6,756,600 B2 | 6/2004 | Ng et al. | |
| 7,655,931 B2 | 2/2010 | Gupta | |
| 9,064,795 B2 | 6/2015 | Koo et al. | |
| 9,093,372 B2 | 7/2015 | Koo et al. | |
| 2002/0000523 A1* | 1/2002 | Ng | H01J 27/08 250/492.21 |
| 2008/0237496 A1* | 10/2008 | Gupta | H01J 37/08 250/492.21 |
| 2008/0248636 A1 | 10/2008 | Olander et al. | |
| 2009/0068082 A1 | 3/2009 | Mills | |
| 2010/0140077 A1 | 6/2010 | Koo et al. | |
| 2011/0159671 A1* | 6/2011 | Kaim | C01B 35/061 438/514 |
| 2011/0309049 A1 | 12/2011 | Papasouliotis et al. | |
| 2013/0260543 A1 | 10/2013 | Koo et al. | |
| 2013/0260544 A1 | 10/2013 | Koo et al. | |
| 2014/0061501 A1 | 3/2014 | Sinha et al. | |
| 2014/0322903 A1 | 10/2014 | Mayer et al. | |
| 2015/0024579 A1 | 1/2015 | Graff et al. | |
| 2015/0354056 A1 | 12/2015 | Koo et al. | |
| 2016/0163509 A1 | 6/2016 | Koo et al. | |
| 2016/0163510 A1 | 6/2016 | Koo et al. | |
| 2016/0211137 A1 | 7/2016 | Tang et al. | |

OTHER PUBLICATIONS

Office action dated Oct. 25, 2016 in co-pending U.S. Appl. No. 14/692,159.
Final rejection dated Apr. 19, 2017 in co-pending U.S. Appl. No. 14/692,159.
International Search Report and Written Opinion dated Mar. 13, 2017 in co-pending PCT application No. PCT/US2016/025996.
Notice of allowance dated Oct. 10, 2017 in co-pending U.S. Appl. No. 14/692,159.

\* cited by examiner

BORON IMPLANTING USING A CO-GAS

This application claims priority to U.S. Provisional Patent Application 62/087,071, filed Dec. 3, 2014, the disclosure of which is incorporated herein by reference in its entirety.

FIELD

Embodiments relate to an apparatus and methods for improving ion beam quality in an ion implantation system, and more particularly, improving boron ion beam quality by using argon gas.

BACKGROUND

Semiconductor workpieces are often implanted with dopant species to create a desired conductivity. For example, solar cells may be implanted with a dopant species to create an emitter region. This implant may be done using a variety of different mechanisms. In one embodiment, an ion source is used.

In an effort to improve process efficiency and lower cost, in some embodiments, the ions extracted from the ion source are accelerated directly toward the workpiece, without any mass analysis. In other words, the ions that are generated in the ion source are accelerated and implanted directly into the workpiece. A mass analyzer is used to remove undesired species from the ion beam. Removal of the mass analyzer implies that all ions extracted from the ion source will be implanted in the workpiece. Consequently, undesired ions, which may also be generated within the ion source, are then implanted in the workpiece.

This phenomenon may be most pronounced when the source gas is a halogen-based compound, such as a fluoride. Fluorine ions and neutrals (metastable or excited) may react with the inner surfaces of the ion source, releasing unwanted ions, such as silicon, oxygen, carbon, and aluminum and heavy metals present as impurity elements. Additionally, halogen ions may also be implanted into the workpiece.

Therefore, an apparatus and a method which improves beam quality, particular for embodiments in which halogen based source gasses are employed, would be beneficial.

SUMMARY

An apparatus and methods of improving the ion beam quality of a halogen-based source gas are disclosed. Unexpectedly, the introduction of a noble gas, such as argon, to an ion source chamber may increase the percentage of desirable ion species, while decreasing the amount of contaminants and halogen-containing ions. This is especially beneficial in non-mass analyzed implanters, where all ions are implanted into the workpiece. In one embodiment, a first source gas, comprising a dopant and a halogen is introduced into an ion source chamber, a second source gas comprising a hydride, and a third source gas comprising a noble gas are also introduced. The combination of these three source gases produces an ion beam having a higher percentage of pure dopant ions than would occur if the third source gas were not used.

According to one embodiment, a method of implanting dopant into a workpiece is disclosed. The method comprises introducing a first source gas into a chamber of an ion source, the first source gas comprising dopant and fluorine; introducing an additional source gas, selected from the group consisting of helium, argon, xenon, neon, and krypton, into the chamber; ionizing the first source gas and the additional source gas in the chamber to form ions in the chamber; and accelerating the ions as an ion beam toward the workpiece, without the use of mass analysis. In a further embodiment, the method further comprises introducing a second source gas comprising hydrogen and at least one of silicon and germanium; ionizing the second source gas in the chamber; and accelerating ions from the second source gas as part of the ion beam. In certain embodiments, a composition of the ion beam is affected by an introduction of the additional source gas.

According to a second embodiment, a method of implanting dopant into a workpiece is disclosed. The method comprises introducing a first source gas into a first sub-chamber of a chamber of an ion source, the first source gas comprising a dopant and fluorine; introducing argon into a second sub-chamber of the chamber; ionizing the first source gas and the argon in the chamber; extracting ions from the first sub-chamber in the form of a dopant ion beam and directing the dopant ion beam toward the workpiece; extracting ions from the second sub-chamber in the form of an argon ion beam and directing the argon ion beam toward the workpiece, where the argon ion beam strikes a location on the workpiece concurrently or after the location has been implanted by the dopant ion beam. In a further embodiment, the method further comprises introducing a second source gas into the first sub-chamber, the second source gas comprising hydrogen and at least one of silicon and germanium; ionizing the second source gas in the chamber; and extracting ions of the second source gas as part of the dopant ion beam. In certain embodiments, the dopant comprises boron.

According to a third embodiment, an apparatus for processing a workpiece is disclosed. The apparatus comprises an ion source, having a chamber defined by chamber walls; a first source gas container, containing a dopant and fluorine, in communication with the chamber; a second source gas container, containing hydrogen and at least one of silicon and germanium, in communication with the chamber; a third source gas container, container at least one gas selected from the group consisting of helium, argon, xenon, neon, and krypton, in communication with the chamber; an RF antenna disposed on a dielectric window in one of the chamber walls; an extraction suppression electrode to attract ions from within the chamber through an aperture in another of the chamber walls toward the workpiece; and a workpiece support to hold the workpiece. In certain embodiments, the dopant comprises boron. In certain embodiments, the ions are implanted in the workpiece without being mass analyzed.

BRIEF DESCRIPTION OF THE FIGURES

For a better understanding of the present disclosure, reference is made to the accompanying drawings, which are incorporated herein by reference and in which.

DETAILED DESCRIPTION

As described above, ionization of halogen-based species, such as fluorides, may cause particles released from the inner surfaces of the ion source to be implanted in the workpiece. These contaminants may include aluminum, carbon, oxygen, silicon, fluorine-based compounds, and other unwanted species (including heavy metals present as impurity elements). One approach to address the damage caused by free halogen ions may be to introduce additional source gasses.

Figure 1A:
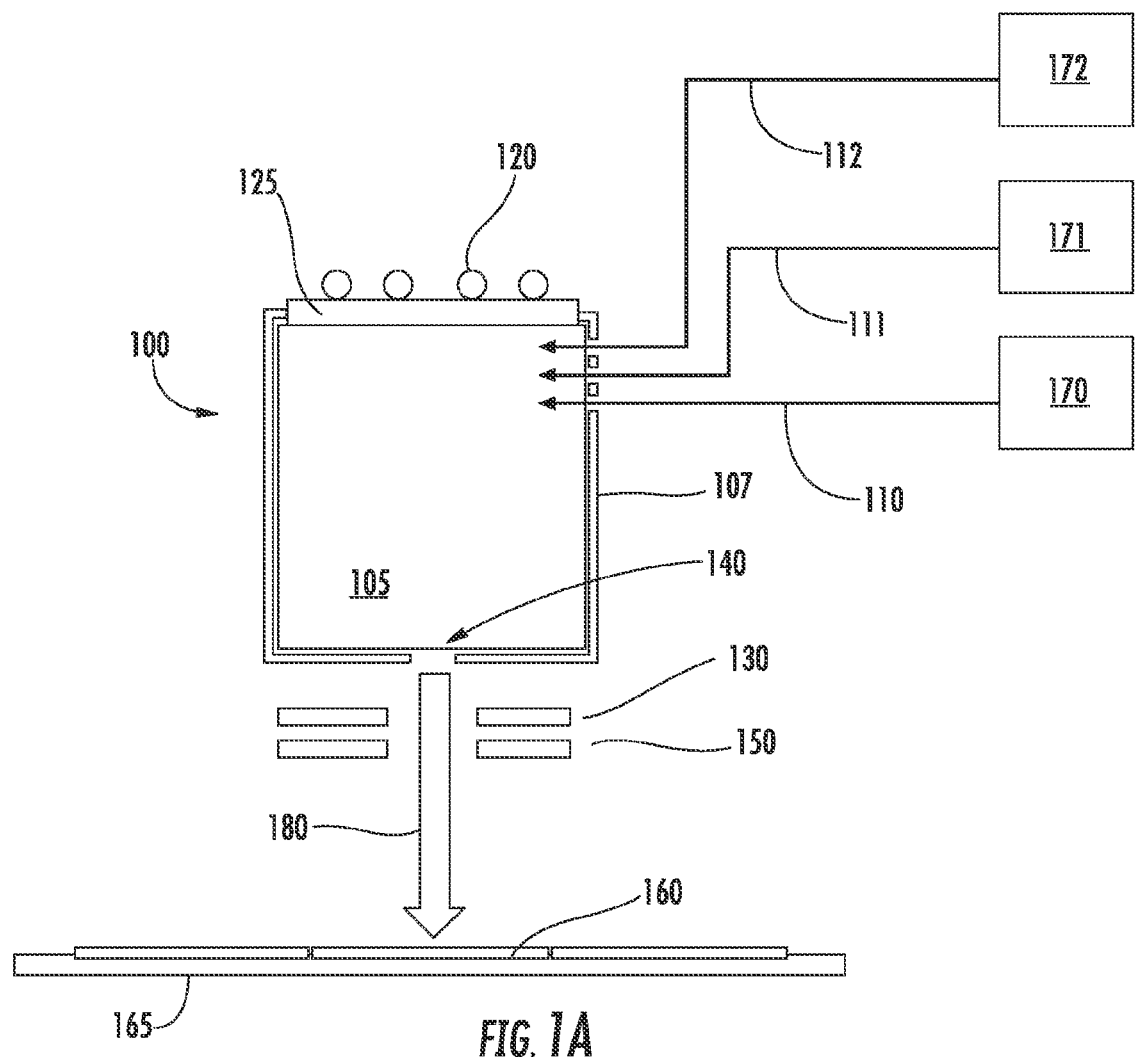
FIGS. 1A-C show implant systems according to different embodiments.
Figure 1B:
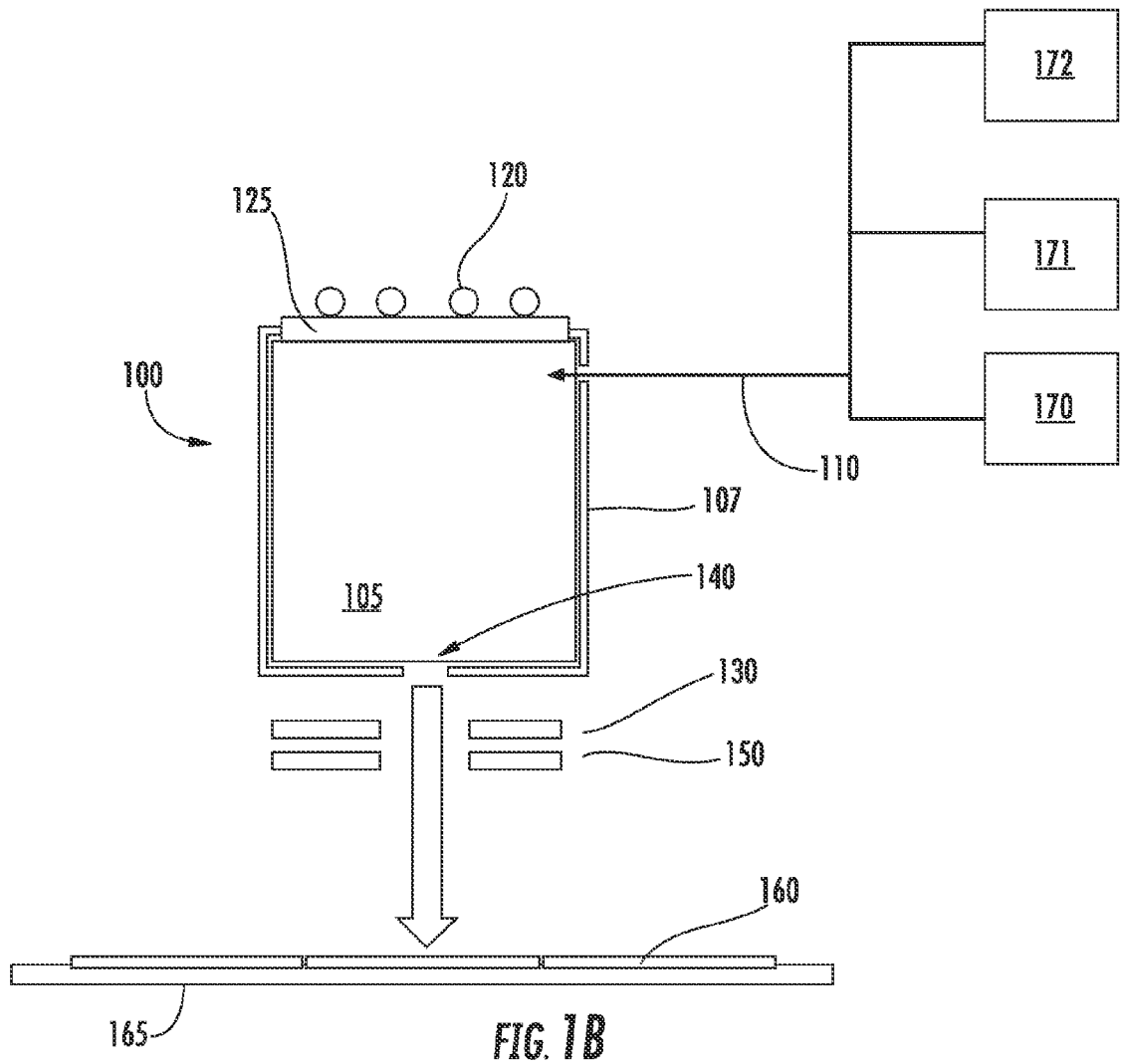
Figure 1C:
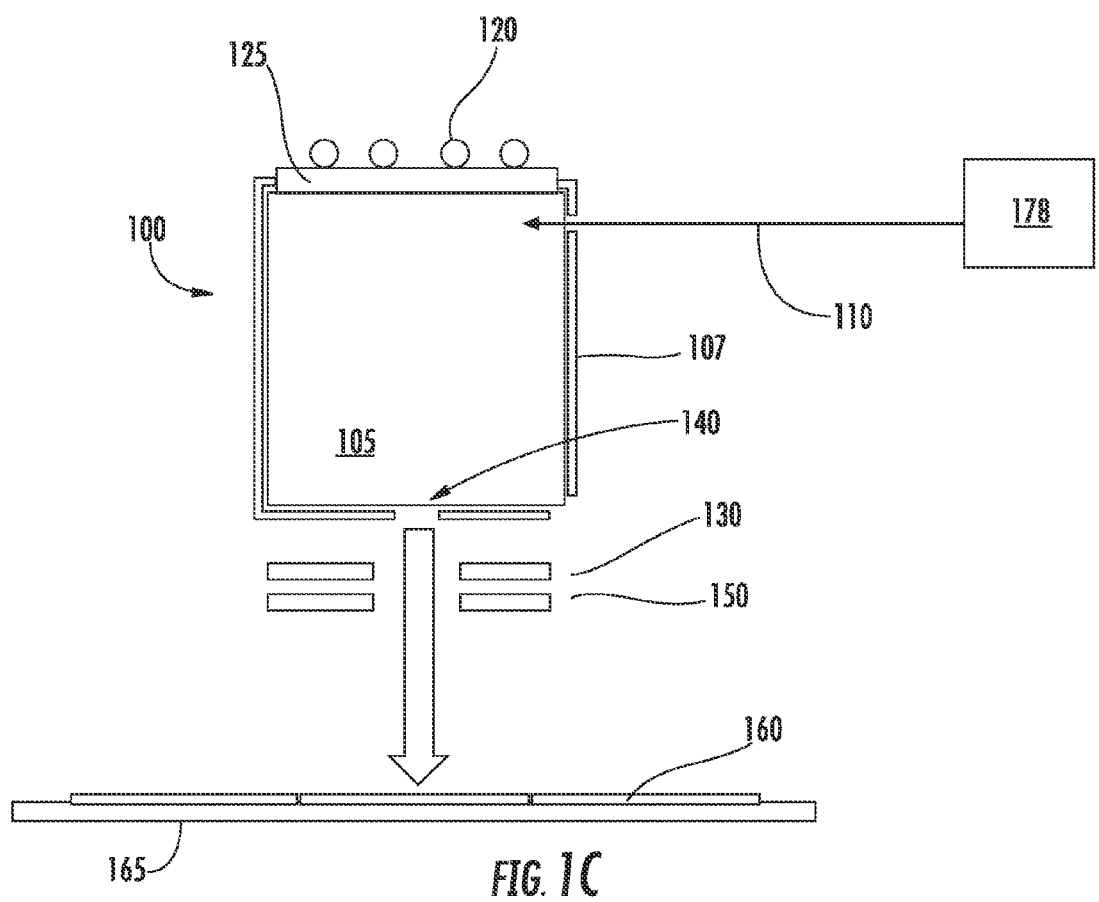

FIGS. 1A-1C show various embodiments in which multiple source gasses may be introduced to an ion source. In each of these figures, there is an ion source 100. This ion source 100 includes a chamber 105 defined by plasma chamber walls 107, which may be constructed from graphite or another suitable material. This chamber 105 may be supplied with one or more source gasses, stored in one or more source gas containers, such as a first source gas container 170, via a gas inlet 110. This source gas may be energized by an RF antenna 120 or another plasma generation mechanism. The RF antenna 120 is in electrical communication with a RF power supply (not shown) which supplies power to the RF antenna 120. A dielectric window 125, such as a quartz or alumina window, may be disposed between the RF antenna 120 and the interior of the ion source 100. The ion source 100 also includes an aperture 140 through which ions may pass. A negative voltage is applied to extraction suppression electrode 130 disposed outside the aperture 140 to extract the positively charged ions in the form of an ion beam 180 from within the chamber 105 through the aperture 140 and toward the workpiece 160, which may be disposed on a workpiece support 165. A ground electrode 150 may also be employed. In some embodiments, the aperture 140 is located on the side of the ion source 100 opposite the side containing the dielectric window 125. As shown in FIG. 1A, a second source gas may be stored in a second source gas container 171 and introduced to the chamber 105 through a second gas inlet 111. A third source gas may be stored in a third source gas container 172 and introduced to the chamber 105 through a third gas inlet 112. In another embodiment, shown in FIG. 1B, a second source gas may be stored in a second source gas container 171 and a third source gas may be stored in a third source gas container 172. The second source gas and the third source gas may both be introduced to the chamber 105 through the same gas inlet 110 used by the first source gas. In yet another embodiment, shown in FIG. 1C, the second source gas and the third source gas may be mixed with the first source gas in a single gas container 178. This mixture of gasses is then introduced to the chamber 105 through gas inlet 110.

In any of these embodiments, the first source gas, the second source gas and the third source gas may be introduced simultaneously or sequentially to the chamber 105. While these figures show the use of three different source gasses, the disclosure is not limited to any particular number. These figures intend to show various embodiments where multiple source gasses may be introduced to a chamber 105. However, other embodiments are also possible and within the scope of the disclosure.

The first source gas, also referred to as the feed gas, may comprise a dopant, such as boron, in combination with fluorine. Thus, the feed gas may be in the form of $DF_n$ or $D_mF_n$, where D represents the dopant atom, which may be boron, gallium, phosphorus, arsenic or another Group 3 or Group 5 element. The second source gas may be a molecule having a chemical formula of $XH_n$ or $X_mH_n$, where H is hydrogen. X may be a dopant species, such as any of those described above. Alternatively, X may also be an atom that does not affect conductivity of the workpiece 160. For example, if the workpiece 160 comprises silicon, X may be a Group 4 element, such as silicon and germanium. The third source gas may be a noble gas, such as helium, argon, neon, krypton and xenon.

In other words, the first source gas may be $BF_3$ or $B_2F_4$, while the second source gas may be, for example, $PH_3$, $SiH_4$, $NH_3$, $GeH_4$, $B_2H_6$, or $AsH_3$. The third source gas may be a noble gas, such as helium, argon, neon, krypton or xenon, in each of these embodiments. This list represents possible species that may be used. It is understood that other species are also possible.

By combining the first source gas with the second source gas, the deleterious effects of the fluorine ions may be reduced. For example, without being limited to any particular theory, the introduction of hydrogen may create a film or coating on the dielectric window 125. This serves to protect the dielectric window 125, which reduces the amount of contaminants originating from the dielectric window 125 that are contained in the extracted ion beam 180. In addition, the second source gas may coat the inner surfaces of the plasma chamber walls 107, which may be another source of contaminants. This coating may reduce the interaction between fluorine ions and the inner surfaces of the plasma chamber walls 107, reducing the amount of contaminants generated.

The introduction of the second source gas may reduce the creation of contaminants and the incorporation of these contaminants in the ion beam. However, in some embodiments, the resulting ion beam produced using the first source gas and the second source gas may not contain a sufficient quantity of the desired ions.

Figure 2:
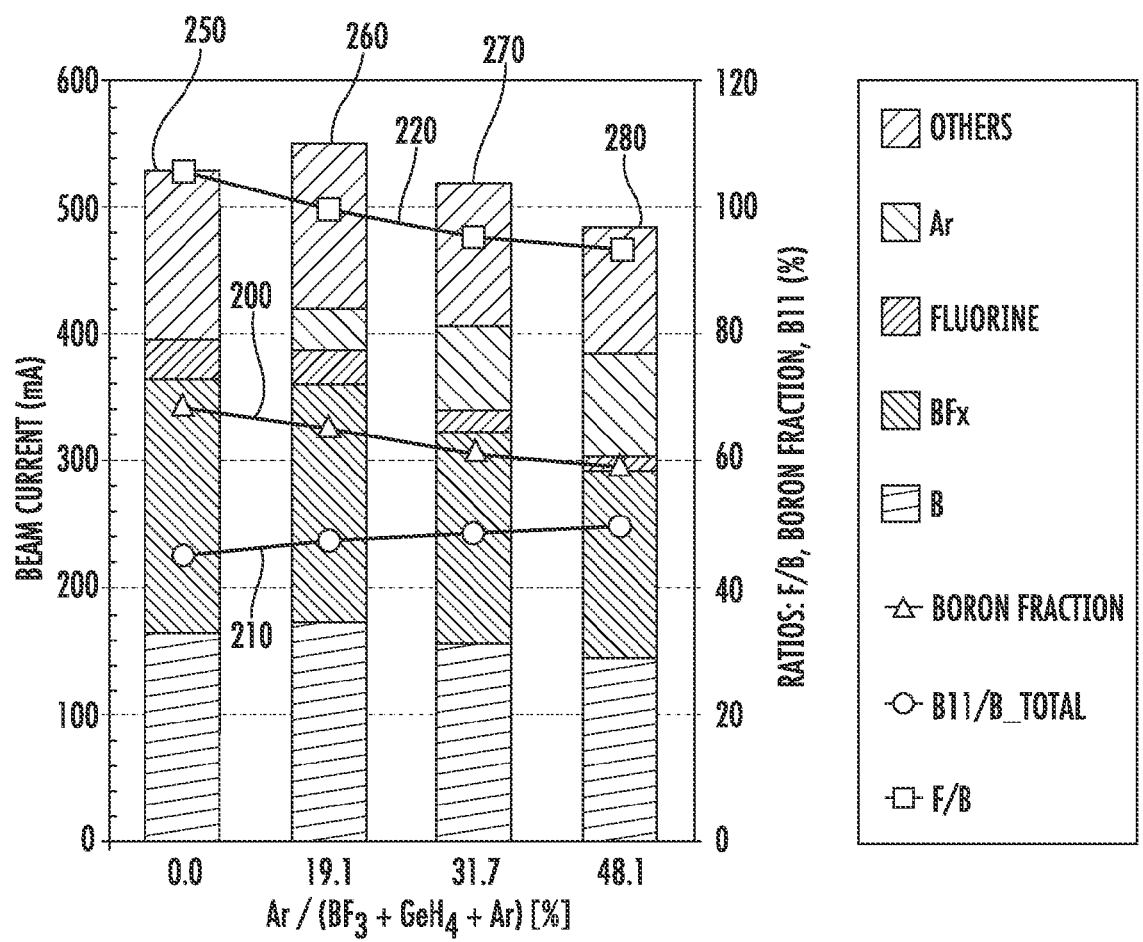
FIG. 2 is a representative graph of ion beam current as a function of argon gas concentration.

FIG. 2 shows a plurality of bar graphs which show the ion species produced by an ion source using $BF_3$ as the first source gas and $GeH_4$ as the second source gas, with a varying amount of argon, which serves as the third source gas. In each of these bar graphs, the RF power was 8 kW, and the combined flow rate of the $BF_3$ and $GeH_4$ was 18 sccm. Additionally, the ratio of $BF_3$ to $GeH_4$ was held constant at 9:1.

In each of the bar graphs, it can be seen that the ion source 100 ionizes the $BF_3$ to form boron ions (i.e. $B^+$), as well as $BF_x^+$ ions, where $BF_x$ includes BF and $BF_2$. Additionally, fluorine ions are created. Finally, a plurality of other ion species, which may be components of the second source gas or may be impurities, is also created.

As described above, the introduction of the second source gas may reduce the amount of contaminants introduced in the ion beam. As stated above, this may be significant when the ion beam is used to implant the workpiece without mass analysis.

Bar graph 250 shows the composition of an ion beam where no argon is introduced. As seen in line 200, in this configuration, nearly 69% of the ions in the ion beam are dopant-containing ions, where, in this example, the dopant is boron. This metric is referred to as the boron fraction, or the dopant fraction. However, many of the dopant-containing ions also contain fluoride, such as in the form of $BF^+$, $BF_2^+$ and $BF_3^+$. In fact, as shown in line 210, only about 45% of the dopant-containing ions are pure dopant (i.e. $B^+$). This ratio is referred to as the boron purity percentage, or the dopant purity percentage. Lastly, while 69% of the ion beam contains boron, a very large percentage of the ions also contain fluorine. In fact, line 220 shows the ratio of ions containing fluorine (which includes pure fluorine as well as $BF^+$, $BF_2^+$ and $BF_3^+$) to pure dopant ions (i.e. $B^+$). Line 220 shows that there are actually more fluorine-containing ions than pure boron ions. This metric is referred to as the F/B ratio.

Bar graph 260 shows the composition of an ion beam where approximately 19% of the total gas introduced to the ion chamber is the third source gas, which may be argon. Note that the total beam current of dopant-containing ions (i.e. B+ and $BF_x+$) remains almost unchanged at about 360 mA. However, there is a change in the composition of the ion beam. Specifically, as seen on line 200, the boron fraction has decreased slightly, mostly due to the additional argon ions that have been created. However, surprisingly, as shown in line 210, the percentage of pure dopant ions as compared to the total number of dopant-containing ions (the boron purity percentage or dopant purity percentage) has actually increased! In fact, the beam current of pure boron ions has also increased. Additionally, the ratio of fluorine-containing ions to pure boron ions (i.e. the F/B ratio), as shown in line 220, has also decreased unexpectedly to about 100%. Additionally, the beam current of fluoride ions has decreased as well. In other words, the introduction of argon as a third source gas affected the composition of the resulting ion beam. Specifically, the introduction of argon has increased the formation of pure boron ions relative to the total number of boron-containing ions. Interestingly, the introduction of argon has also decreased the ratio of fluorine-containing ions to pure boron ions. As stated above, in embodiments where mass analysis is not performed, these changes may improve the performance of the implanted workpiece.

Each of these trends continues as a greater percentage of argon is introduced. Bar graph 270 shows the composition of the ion beam where about 32% of all gas introduced into the chamber 105 comprises argon. At this concentration, the beam current of boron-containing ions begins to decrease slightly, from 360 mA to about 320 mA. The boron fraction has also decreased slightly due to the increased number of argon ions. However, other metrics have improved. Specifically, the boron purity percentage actually increased to nearly 50%. Additionally, the F/B ratio decreased to about 95%. Interestingly, the amount of other species, which includes all ions that are not boron-containing ions, fluorine ions or argon ions, actually decreases at this argon percentage. The beam current of fluorine ions also decreases to less than about 20 mA.

Bar graph 280 shows the composition of the ion beam where about 48% of all gas introduced into the chamber 105 comprises argon. At this concentration, the beam current of boron-containing ions again decreases slightly, from 320 mA to about 300 mA. The boron fraction has also decreased slightly to about 60% due to the increased number of argon ions. However, other metrics have improved. Specifically, the boron purity percentage actually increased to over 50%. Additionally, the F/B ratio decreased to about 90%. Again, the beam current of the other species has decreased as well. The beam current of fluorine ions also decreases to less than about 10 mA.

This unexpected result has many implications.

First, heavier dopant-containing ions, such as $BF^+$, $BF_2^+$ and $BF_3^+$ tend to be implanted at a more shallow depth than pure dopant ions, such as $B^+$. During the subsequent thermal treatment, these shallowly implanted ions are more likely to diffuse out of the workpiece. In other words, the total beam current of all dopant-containing ions may not be indicative of the amount of dopant that is actually implanted and retained in the workpiece. Without wishing to be bound to any particular theory, it is believed that the argon metastables in the plasma may break down the larger dopant-containing ions into more desirable pure dopant ions.

Secondly, the implanting of fluorine, in any form, may be deleterious effects. The implanting of fluorine ions may cause defects in the workpiece, which affects its performance. The implanted fluorine may also cause the dopants to diffuse out from the workpiece. Fluorine is also known to retard the dopant diffusion into the workpiece, making the annealed dopant profile shallow, which is not preferable for solar cell applications.

Third, the introduction of argon has a limiting effect on the generation of other species, also referred to as contaminants, that are generated. Without wishing to be bound to any particular theory, it is believed that argon stabilizes the plasma, resulting in a reduction in chamber wall sputtering. Due to its large ionization cross-section, argon is relatively easy to ionize and stabilizes the discharge. Because of this, the plasma is maintained at relatively low plasma potential, so that ion sputtering from the wall material can be reduced.

Fourth, during the implanting of the workpiece, the argon ions may sputter on the surface deposition layer of the workpiece. This may serve to remove any materials that are deposited during the implant process. Some of these materials may be difficult to remove via a wet chemistry process after the implant.

Thus, an ion beam having reduced beam impurity and increased dopant purity can be created by using three source gasses. The first source gas, or feedgas, may be a species that contains both a dopant and fluorine, such as $BF_3$ or $B_2F_4$. The second source gas may be a species that contains hydrogen and either silicon or germanium, such as silane ($SiH_4$) or germane ($GeH_4$). The third source gas may be argon or another noble gas. These three source gasses are introduced into a chamber 105 of an ion source 100, either simultaneously or sequentially, where they are ionized. The ion source may use RF energy generated by RF antenna 120. In another embodiment, the ion source may utilize the thermionic emission of electrons using an IHC. Other methods of ionizing a gas may also be used by the ion source. Ions from all three source gasses are extracted through aperture 140 through use of extraction suppression electrodes 130 and ground electrode 150 and accelerated toward a workpiece 160, where they are implanted into the workpiece 160. As described earlier, these ions may not be mass analyzed, meaning that all extracted ions are implanted into the workpiece 160.

The change in ion beam composition may also positively affect the concentration of various species in the implanted workpiece. In one test, a first workpiece implanted with $B_2F_4$ and $GeH_4$, in the ratios described above, was compared to a second workpiece implanted with the same gasses with the addition of argon, in an amount of 30% of the total gas introduced. It was found that at all depths of the workpieces, the concentration of boron implanted in the second workpiece was greater than the concentration of boron in the first workpiece. Furthermore, it was found that, at all depths, the concentration of fluorine was lower in the second workpiece than in the first workpiece. In fact, the concentration of fluorine at a depth of 40 nm was about 8E+19 in the first workpiece and only 6E+19 in the second workpiece, representing a reduction of 25%. Similar reductions in fluorine concentration were seen at depths from about 35 nm up to 60 nm.

In another example, the second source gas may include a dopant having the opposite conductivity. For example, the first source gas, or feedgas, may be a species than contains both boron and fluorine, such as $BF_3$ or $B_2F_4$. The second source gas may be a species that contains hydrogen and a Group V element, such as phosphorus, nitrogen or arsenic.

While FIG. 2 shows the results when boron is used as the dopant in the first source gas, the disclosure is not limited to this embodiment. Other dopants, such as gallium, phosphorus, arsenic or other Group 3 and Group 5 elements, may be used.

The above disclosure discusses that the third source gas may be introduced in amounts ranging from about 19% to about 48%. However, the disclosure is not limited to this range. In some embodiments, the third source gas may be introduced in amounts ranging from about 15% to about 30%. In other embodiments, the third source gas may be introduced in amounts ranging from about 15% to about 40%. In other embodiments, the third source gas may be introduced in amounts ranging from about 15% to about 50%. Additionally, the ratio of the first source gas to the second source gas may be about 9:1, although other ratios may also be used. The combined flow rate of the first source gas and the second source gas may be between 10 and 20 sccm.

While the above description discloses the use of three source gasses, in other embodiments, two source gasses may be used. For example, in some embodiments, as described above, the first source gas may be in the form of $DF_n$ or $D_mF_n$, where D represents the dopant atom, which may be boron, gallium, phosphorus, arsenic or another Group 3 or Group 5 element. In certain embodiments, the second source gas is not used. Instead, only the first source gas and the third source gas are combined in the ion source 100. In this embodiment, the flow rate of the first source gas may be between 10 and 30 sccm. In one embodiment, the third source gas may constitute between 20% and 40% of the total gas introduced to the chamber 105. In some embodiments, the third source gas may be introduced in amounts ranging from about 15% to about 30%. In other embodiments, the third source gas may be introduced in amounts ranging from about 15% to about 40%. In other embodiments, the third source gas may be introduced in amounts ranging from about 15% to about 50%.

As described above, the introduction of argon with the $BF_x$ gas may affect the composition of the resulting ion beam. Specifically, the boron purity percentage may be increased, while the F/B ratio may decrease. In other words, the change in the composition of the ion beam may occur without the use of the second source gas.

Figure 3:
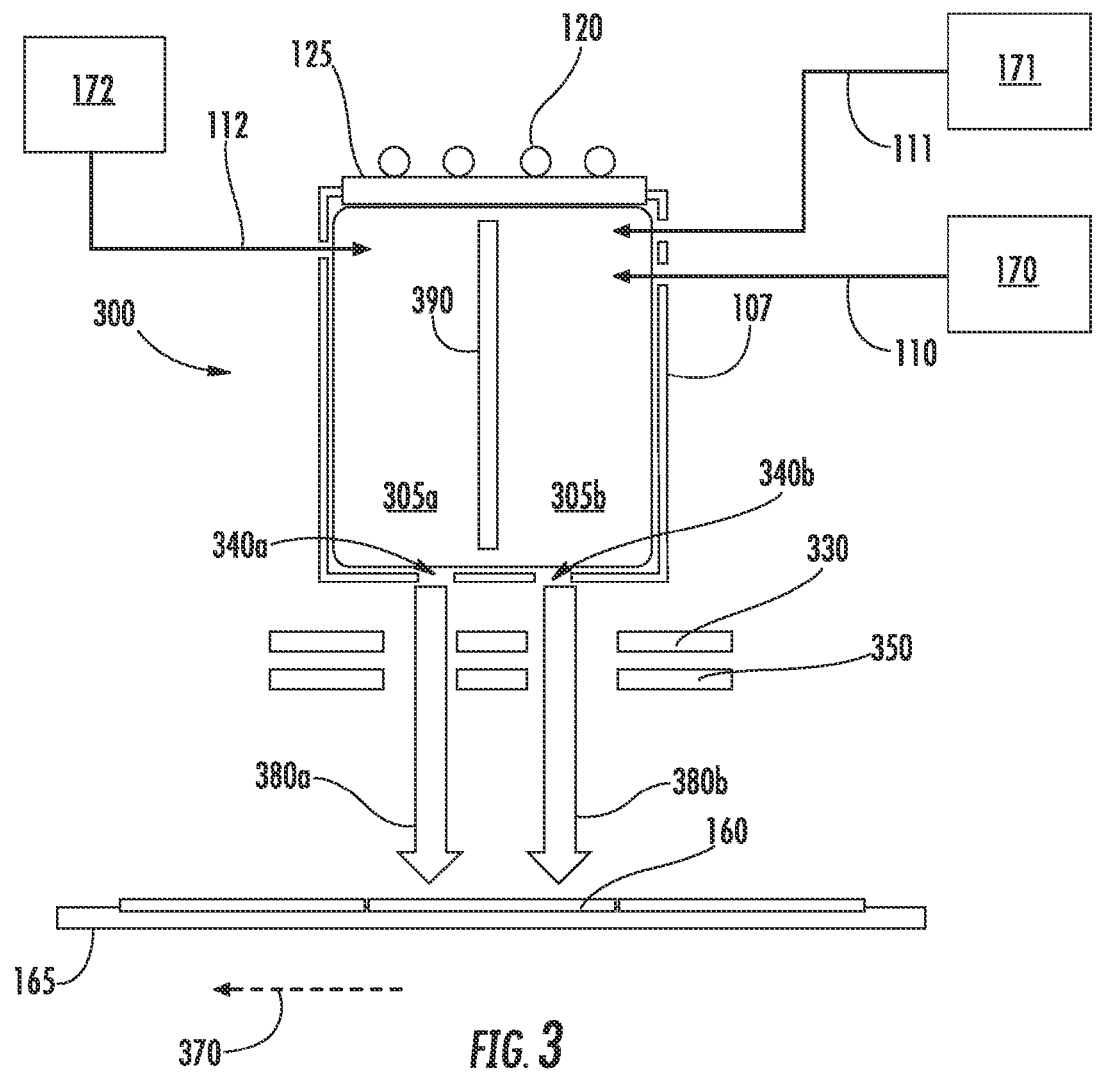
FIG. 3 shows an implant system according to another embodiment.

FIG. 3 shows another embodiment. In this embodiment, the ion source 300 has a chamber separator 390 disposed within the chamber, effectively separating the chamber into a first sub-chamber 305a and a second sub-chamber 305b. Each of first sub-chamber 305a and second sub-chamber 305b has a respective aperture 340a, 340b. Additionally, the ground electrode 350 and extraction suppression electrode 330 may be modified to have two openings, corresponding to apertures 340a, 340b. As before, the chamber has a dielectric window 125 and an RF antenna 120 disposed thereon. In this embodiment, the first source gas is stored in first source gas container 170 and is introduced to the second sub-chamber 305b through the gas inlet 110. The first source gas is any of the species described above. The second source gas is stored in the second source gas container 171 and is introduced to the second sub-chamber 305b through the second gas inlet 111. The second source gas is any of the species described above. As described with respect to FIG. 1B, in some embodiments, the first source gas container 170 and the second source gas container 171 may be connected to a single gas inlet. In another embodiment, illustrated in FIG. 1C, the first and second source gasses may be mixed in a single source gas container. Additionally, in some embodiments, the second source gas is not used, as described above. As described above, the ratio of the first source gas to the second source gas may be about 9:1, although other ratios may be used. The combined flow rate may be between 10 and 20 sccm. Argon is stored in third source gas container 172 and introduced to the first sub-chamber 305a through the third gas inlet 112.

In this embodiment, an argon ion beam 380a is extracted through aperture 340a. Concurrently, a dopant ion beam 380b is extracted through aperture 340b. This dopant ion beam 380b contains boron-containing ions, as well as fluorine ions, and other ion species.

In FIG. 3, the argon ion beam 380a and the dopant ion beam 380b are parallel to one another so that they strike the workpiece 160 at different locations. In this embodiment, the workpiece is scanned in the direction indicated by arrow 370. In this way, each location on the workpiece 160 is first implanted by dopant ion beam 380b, and then struck by argon ion beam 380a. As described above, the argon ion beam 380a may serve to sputter deposition layer material from the surface of the workpiece 160, which was deposited during the implant of dopant ion beam 380b.

As explained above, the argon implant may remove material from the surface deposition layer, which is difficult to remove using wet chemistry.

In another embodiment, the argon ion beam 380a and the dopant ion beam 380b are directed or focused so that they simultaneously strike a location on the workpiece 160. In this embodiment, the workpiece 160 can be scanned in any direction.

In yet another embodiment, the two implants may be sequentially, such that the entire workpiece 160 is implanted by the dopant ion beam 380b. At a later time, an argon ion beam 380a is directed toward the workpiece 160.

In each of the embodiments described herein and associated with FIG. 3, the implants may be performed without mass analysis, such that all of the extracted ions strike the workpiece.

In one test, a first workpiece, implanted in the conventional manner, was compared to a second workpiece implanted using the apparatus of FIG. 3. Both were implanted with a combination of $B_2F_4$ and $GeH_4$. The concentration of boron at the surface of each workpiece after the implantation process was then measured. The first workpiece had a concentration of boron at the surface of roughly 9E+20 atoms/cc, while the second workpiece had a concentration of boron at the surface of roughly 5E+20 atoms/cc, representing a reduction of over 40%. This may be due to the sputtering effect of argon.

Furthermore, although the embodiments disclosed herein describe the use of argon as the third source gas, the disclosure is not limited to this embodiment. As stated above, other noble gasses, such as helium, neon, krypton and xenon, may also be used as the third source gas. Alternatively, a combination of noble gasses may serve as the third source gas.

The embodiments described herein have many advantages. As described above, the introduction of a third source gas may affect the composition of the extracted ion beam. For example, the percentage of pure dopant ions may increase. Further, the ratio of fluorine-containing ions to pure dopant ions may decrease. These changes to the composition of the ion beam may change the concentration of fluorine and dopant in the implanted workpiece. For example, as described above, in one test, the amount of fluorine at a depth of 40 nm in the workpiece was decreased by 25% through the use of a third source gas. Additionally, the concentration of dopant at all depths was increased.

Additionally, the use of an ion source having sub-chambers, where one sub-chamber creates a dopant ion beam and the second sub-chamber creates an argon ion beam, may decrease the surface concentration of dopant on an implanted workpiece. As described above, in one test, the concentration of boron at the surface of an implanted workpiece was decreased by 40% by subjecting the workpiece to an argon ion bean, as illustrated in FIG. 3.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting dopant into a workpiece, comprising:
    introducing a first source gas into a chamber of an ion source, the first source gas comprising dopant and fluorine, wherein the dopant comprises boron;
    introducing a second source gas comprising hydrogen and at least one of silicon and germanium;
    introducing an amount of an additional source gas, selected from the group consisting of helium, argon, xenon, neon, and krypton, into the chamber;
    ionizing the first source gas, the second source gas and the additional source gas in the chamber to form ions in the chamber; and
    accelerating the ions as an ion beam toward the workpiece, without the use of mass analysis,
    wherein the amount of additional source gas introduced into the chamber is selected so as to maximize a beam current of pure dopant ions extracted from chamber.

2. The method of claim 1, wherein a composition of the ion beam is affected by an introduction of the additional source gas.

3. The method of claim 2, wherein an amount of pure dopant ions in the ion beam is increased as a percentage of all dopant-containing ions by introducing the additional source gas.

4. The method of claim 2, wherein a ratio of fluorine-containing ions to pure dopant ions in the ion beam is decreased by introducing the additional source gas.

5. The method of claim 2, wherein an amount of ions in the ion beam that do not contain dopant, fluorine, or the additional source gas decreases by introducing the additional source gas.

6. The method of claim 1, wherein the additional source gas comprises between 15-50% of total gas introduced into the chamber.

7. The method of claim 1, wherein the first source gas comprises $BF_3$.

8. The method of claim 1, wherein the first source gas comprises $B_2F_4$.

9. The method of claim 1, wherein the ions are extracted through an aperture in the chamber and accelerated toward the workpiece by an extraction suppression electrode.

10. A method of implanting dopant into a workpiece, comprising:
    introducing a first source gas into a chamber of an ion source, the first source gas comprising dopant and fluorine, wherein the dopant comprises boron;
    introducing a second source gas comprising hydrogen and at least one of silicon and germanium;
    introducing an amount of an additional source gas, selected from the group consisting of helium, argon, xenon, neon, and krypton, into the chamber;
    ionizing the first source gas, the second source gas and the additional source gas in the chamber to form ions in the chamber; and
    accelerating the ions as an ion beam toward the workpiece, without the use of mass analysis,
    wherein the amount of additional source gas introduced into the chamber is selected so that a beam current of pure dopant ions extracted from chamber is greater than a beam current of pure dopant ions that would be extracted if the additional source gas was not introduced.

11. The method of claim 10, wherein the additional source gas comprises between 15-50% of total gas introduced into the chamber.

12. The method of claim 1, wherein the first source gas comprises $BF_3$ or $B_2F_4$.

* * * * *